United States Patent [19]

Beltramini

[11] Patent Number: 4,943,744
[45] Date of Patent: Jul. 24, 1990

[54] DIFFERENTIATING LOGICAL CIRCUIT FOR ASYNCHRONOUS SYSTEMS

[75] Inventor: Angelo Beltramini, Galliate, Italy

[73] Assignee: Montedison S.p.A., Milan, Italy

[21] Appl. No.: 449,428

[22] Filed: Dec. 14, 1989

Related U.S. Application Data

[63] Continuation of Ser. No. 370,155, Jun. 22, 1989, abandoned, which is a continuation of Ser. No. 165,908, Mar. 9, 1988, abandoned.

[30] Foreign Application Priority Data

Mar. 11, 1987 [IT] Italy .................. 19648 A/87

[51] Int. Cl.$^5$ .................................. H03K 17/04
[52] U.S. Cl. ................................ 307/480; 307/273; 307/470; 307/479
[58] Field of Search ............. 307/443, 470, 479, 359, 307/265, 271, 272.1, 273, 480; 328/127

[56] References Cited

U.S. PATENT DOCUMENTS

| 3,792,362 | 2/1974 | Grant | 307/470 X |
|---|---|---|---|
| 4,321,484 | 3/1982 | Blaser | 307/273 |
| 4,423,338 | 12/1983 | Eardley | 307/273 |
| 4,425,514 | 1/1984 | Orr et al. | 307/273 X |
| 4,439,689 | 3/1984 | Chazenfus | 307/273 X |
| 4,502,014 | 2/1985 | Bismarck | 307/273 X |
| 4,607,173 | 8/1986 | Knoedl, Jr. | 307/291 |
| 4,620,118 | 10/1986 | Barber | 307/470 X |
| 4,685,103 | 8/1987 | Black | 307/273 X |
| 4,700,187 | 10/1987 | Furtek | 357/45 X |

OTHER PUBLICATIONS

Fletcher, An Engineering Approach to Digital Design, Prentice-Hall, Inc., New Jersey, 1980, pp. 653–661.

Primary Examiner—David Hudspeth
Attorney, Agent, or Firm—Stevens, Davis, Miller & Mosher

[57] ABSTRACT

A differentiating circuit is disclosed for use in asynchronous networks which associates the transfer of information through the circuit with the occurrence of the acquisition of the information by a utilizing circuit. The circuit can be used as a differential signal producer or, in combination with other circuits, to form AND, OR etc. logical circuits having a differentiated signal output.

48 Claims, 5 Drawing Sheets

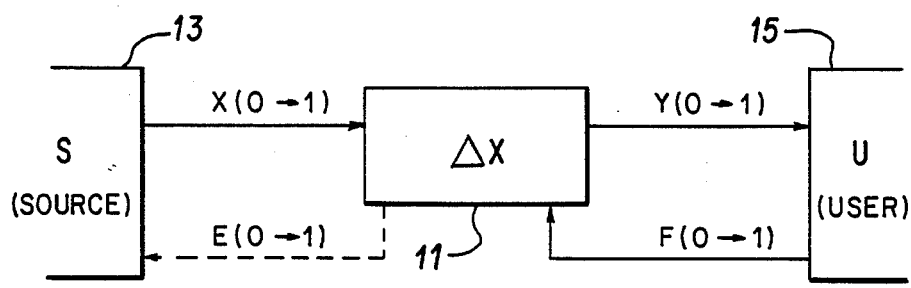
FIG. 1
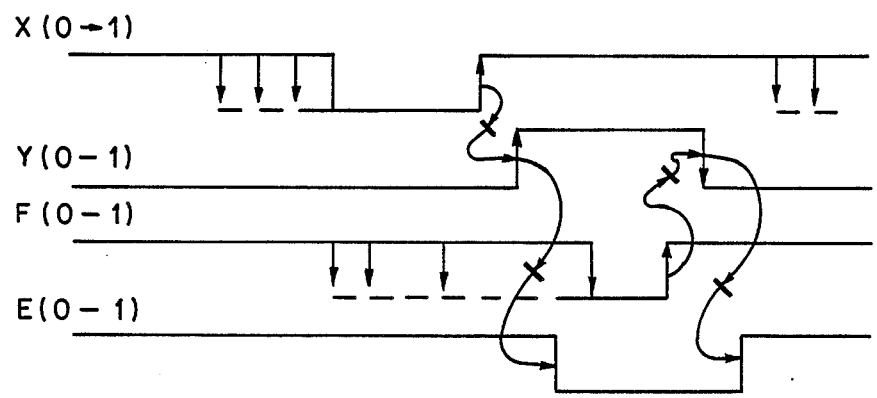
FIG. 2
| X | F | Y |
|---|---|---|
| 0→1 | X | 0→1 |
| 1 | 1→0 | 1 |
| 1 | 0→1 | 1→0 |
FIG. 3

| X | F | Y |
|---|---|---|
| 0→1 | 0 | 0→1 |
| 1 | 0 | 1 |
| 1 | 0→1 | 1→0 |
FIG. 7
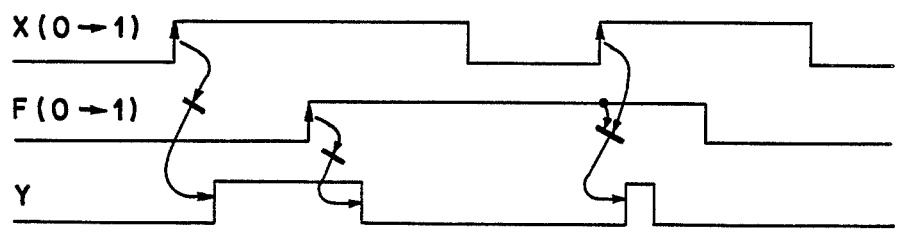
FIG. 8
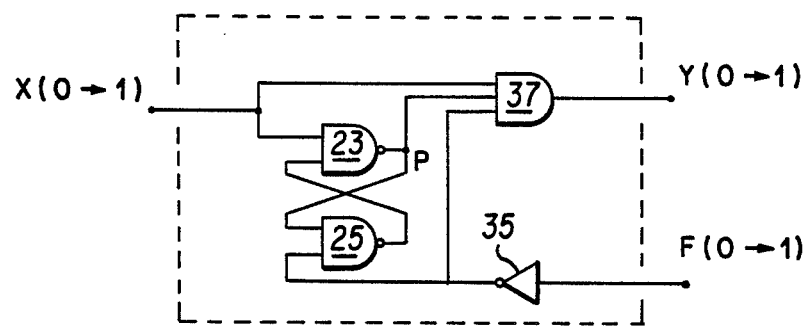
FIG. 9

DIFFERENTIATING LOGICAL CIRCUIT FOR ASYNCHRONOUS SYSTEMS

This application is a continuation, abandoned of application Ser. No. 370,155, filed Jun. 22, 1989, which in turn is a continuation of application Ser. No. 165,908, filed Mar. 9, 1988, abandoned.

BACKGROUND OF THE INVENTION

1. Field of the Invention

The present invention is directed to a differentiating circuit for asynchronous systems and, more particularly to a self-clocking, self-timing differentiating circuit for digital asynchronous systems which can be used alone as a differentiating circuit or in combination with other circuits to form AND, OR, etc. logical circuits having a differentiated signal output.

2. Description of the Prior Art

Boolean algebra is frequently used to specify the states entered by logical circuits by means of tables that indicate output values in connection with inputs for combinatorial networks, and also to specify inside states for sequential networks. The representation is a description of "steady" variables, as of the elements that perform the logical operations were ideal elements lacking any physical feature whatever. Of course, in actual circuit implementation the physical parameters that "deviate" from the ideal behavior of these circuits must also be considered. The usual methods for implementation of digital circuits takes into account such deviating parameters in a merely "statistical" manner, without considering the variables of interest during signal transitions, since under this circumstance they would assume values generally defined as arbitrary. To avoid effects of such arbitrary values a "clock" element is typically used which enables the circuit to settle for the necessary time in order that the transients caused by the various transit times, particularly of physical devices, may expire. In other words, the clock enables the operations to occur in orderly fashion by connecting the timing with only the stable circuit conditions evoked by Boolean algebra so that transient arbitrary values are not used.

It is also known that circuits which utilize signals from a logic circuit may use signals having transient variations. The concept of variation is, however, tied to the mathematical concept of the first derivative of the variable as compared with time.

The solution of the practical problem of utilization of the "time derivative" signal is achieved by circuits that are edge triggered. Edge triggered circuits have associated therewith a certain time which is likely sufficient so that circuits which use the meaning of the signal variation may utilize it as required. Thus, the derivative is built up by artiface using a local clock, the start of which of controlled by the variation of the variable and the stop of which is determined by a previously set time value. Naturally, the use of clock circuits to control the timing of various digital circuits introduces additional complexity and expense to the overall circuit design.

SUMMARY OF THE INVENTION

Applicant has discovered that the time constraint represented by the presence of the clock may be overcome by means of a differentiating circuit which operates under the condition that the signal. Which represents the derivative of the variable, continues to exist until the user of the meaning of the occurred signal variation has utilized it as required. This is accomplished by introducing into the differentiation circuit a feedback signal which is generated when a circuit receiving the derivative signal of the differentiation circuit utilizes that derivative signal. The feedback signal is used to disable the derivative signal. This will be the "minimum time" associated with the time derivative. A shorter time might not let the derivative assume any meaning, since the derivative signal might not have been utilized by the user.

It is exactly "the utilization of the meaning of occurred signal variation" that actually supplies the concept of "time discretization" inasmuch as, by definition, there will exist, under that circumstance, no "lesser time" for the acquisition of that meaning.

Borrowing a definition having a relativity character one might introduce a new concept of "space-time discrete" and draw a different methodology for the description of logical networks. Besides a simple differentiating circuit, performing the transfer of one only meaning through the feedback signal previously described, other differential logical circuits such as NOT, AND, OR and also more complex functions obtained by combining these can be realized. Therefore, the subject matter of the present invention is hereinafter called a DERIVER circuit for asynchronous systems which has at least one input signal of a variable (X), a derivative output signal (Y) produced by a change in state of the input signal(s) (X) and a feedback input signal (F) which controls how long the derivative output is available to a circuit which utilizes it.

Namely, the subject matter of the present invention, a so-called DERIVER, is a class of circuits that perform any logical function, be it simple or complex, both combinatorial and sequential, at different integration grades and that utilize both positive and negative logics, and which control the duration of the existence of derivative output signal by a feedback signal from a circuit which utilizes the derivative output signal.

The invention will be better understood by reference to the following detailed description which is provided in connection with the accompanying drawings.

BRIEF DESCRIPTION OF THE DRAWINGS

FIG. 1 is a block diagram illustrating the operation of a DERIVER circuit in accordance with the present invention;

FIG. 2 is a general timing diagram of the DERIVER circuit operation;

FIG. 3 is a table illustrating the general operation of the DERIVER circuit;

FIG. 7 is a table illustrating operation of the FIG. 6 DERIVER circuit;

FIG. 8 is a specific timing diagram of the FIG. 6 DERIVER circuit;

FIG. 9 is a schematic diagram of a third embodiment of a DERIVER circuit of the invention;

DETAILED DESCRIPTION OF THE INVENTION

The following discussion will use the terms "active logical level =1" (positive logic), and "active variation =(0→1)" (positive edge) in describing the invention. However, it should be understood that the invention could also be described with an active logical =O and the active variation (1→0), or other combinations of active level and signal transition. Accordingly, the notation used is by no means limiting of the invention.

FIG. 1 represents the block diagram of a ΔX DERIVER 11 placed in environment of use. FIG. 2 shows the time representation of signal variations in accordance with the invention associated with the FIG. 1 DERIVER circuit, which may be summarized as follows: "only the variation (0→1) of variable X produces an equivalent variation (0 →1) of variable Y. This occurs independently from the state of feedback variable F. Only the variation (0→1) of variable F which occurs when the derivative signal Y is used by a downstream utilization circuit 15 will cause the variable Y to return to its rest state, i.e., (1→0). Now the DERIVER circuit is ready for the next operation. It is clear that variable X on which the differentiating operation is performed will have to remain steady during the operation itself.

A feedback signal E (0→1) heading back to the source 13 of signals to the DERIVER circuit ΔX can be easily obtained from the same DERIVER; it is the complement of output signal Y. In other words if the source S itself is a DERIVER circuit, the signal E from the ΔDERIVER is the feedback signal to the source S.

Figure 4:
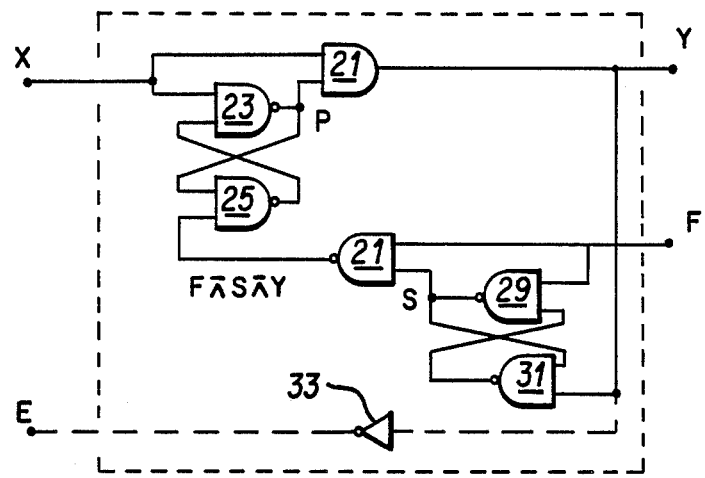
FIG. 4 is a schematic diagram of a first embodiment of a DERIVER circuit of the invention.

The logical signal table for the FIG. 1 DERIVER is represented in FIG. 3, while FIG. 4 illustrates the schematic diagram of the DERIVER 11.

The FIG. 4 embodiment includes an AND gate 21 which receives the input signal X and an output signal P from NAND gate 23 which is one of two NAND gates (23, 25) cross-coupled to form a flip-flop. Another input to NAND gate 23 is taken from the output of NAND gate 25, which receives as its inputs, the signal P and the output of a NAND gate 27. NAND gate 27 receives as inputs thereto, the feedback signal F and the S output of NAND gate 29, which is one of two NAND gates (29, 31) cross-coupled to form another flip-flop. NAND gate 29, receives at its inputs, the feedback signal F and the output of NAND gate 31, and NAND gate 31 in turn receives as its input the signal Y and the signal S. An inverter 33 also receives the signal Y and provides an inverted signal Y as the signal E.

Figure 5:
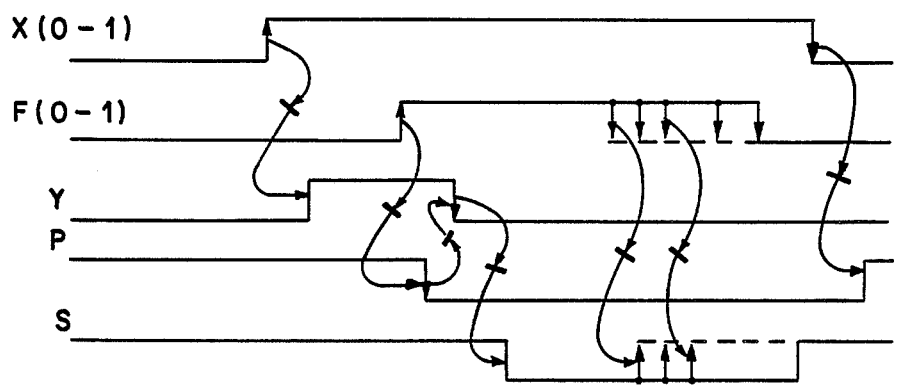
FIG. 5 is a timing diagram for the DERIVER illustrated in FIG. 4.

The logical equation of the FIG. 4 circuit is:

$$Y = X \cap P \cap (\overline{F} \cap \overline{S} \cap Y),$$

where ∩ indicates an AND function and $\overline{\cap}$ indicates a negative AND function. FIG. 5 shows the complete timing diagram for the FIG. 4 circuit.

The operation of this device, namely, the generation of the derivative signal Y in connection with the significant transition applied to input signal X, is fully independent from the current state of feedback signal F; disabling of the derivative signal Y (1→0) will occur only through a significant transition (0→1) of the feedback signal F.

Specific applications allow some significant circuit simplifications that are suggested by assigning apriori the values of variables. The simplification is obtained by assigning the value F=0 to feedback during transition (0→1) of the input variable X. It ensues the equality:

$$F = F \cap S \cap Y$$

Figure 6:
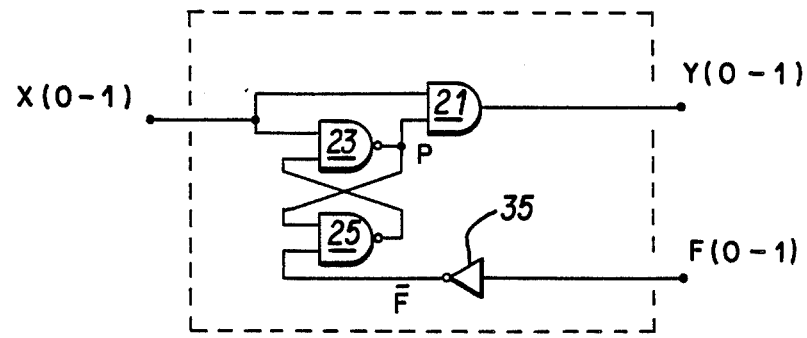
FIG. 6 is a schematic diagram of a second embodiment of a DERIVER circuit of the invention.

This allows eliminating the circuit comprising gates 27, 29 and 31 that makes independent the logical level of feedback during transition X (0→1) of the input variables, and replacing it with an inverter 35. The simplified DERIVER circuit is shown in FIG. 6. The logical equation of the FIG. 6 device is:

$$Y = X \cap (P \cap \overline{F}).$$

Its Boolean operation table and the timing diagram are represented in FIGS. 7 and 8, respectively.

An analysis of the transition diagram shows the existence of a static hazard in output in case the assignment F=0 during the transition X (0→1) is disregarded. This static hazard is eliminated by adding one connection, as shown in FIG. 9, and the use of a three input AND gate 37 in place of the two input AND gate 21, with AND gate 37 receiving the signals X, P and $\overline{F}$. It is observed that the logical equation for the circuit has not changed:

$$Y = X \cap (P \cap \overline{F}).$$

DERIVER circuits constructed in accordance with the invention, in their elementary form, can be considered as having two separate parts: the first one is the logical operator that is an AND gate (e.g., gate 21) in the case of non-inverting DERIVER; the second part is an RS flip-flop (e.g., formed by gates 23, 25) that has the function of memorizing the inside state of the DERIVER.

FIG. 4 depicts a first type of DERIVER constructed in accordance with the invention, while the simplified circuit of FIG. 6 depicts a second type. The FIG. 9 circuit represents yet a third type of DERIVER.

Summarizing, a DERIVER circuit of the invention can use the feedback signal in different ways, the first type generate the output signal Y in full independence from the feedback signal (FIG. 4) while the second and the third (FIGS. 6, 9) generate the output signal Y depending on the status of the feedback signal F, but, in any event, all circuits share the characteristic that the active transition of the feedback signal F is needed to return the output signal Y to a rest state (1→0).

Using the DERIVER circuits thus described, it is possible to perform simple logical functions. The function of a NOT DERIVER (Δ NOT) is obtained by complementing the DERIVER Y output signal, using an inverter.

The logical function AND is produced by the product of values of input $x_1$, $x_2$ signals as $Y = (x_1 \cap x_2)$; in this case the AND function in output Y will depend also on the state of the DERIVER ($P \cap \overline{F}$), thus the equation and the AND DERIVER (Δ AND) will be:

$$Y = (x_1 \cap x_2) \cap (P \cap \overline{F})$$

Figure 10:
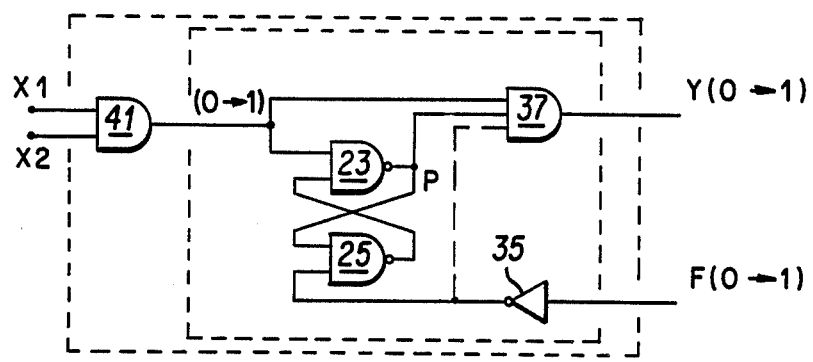
FIG. 10 is schematic diagram of DERIVER circuit of the invention implementing an AND function.
Figure 11:
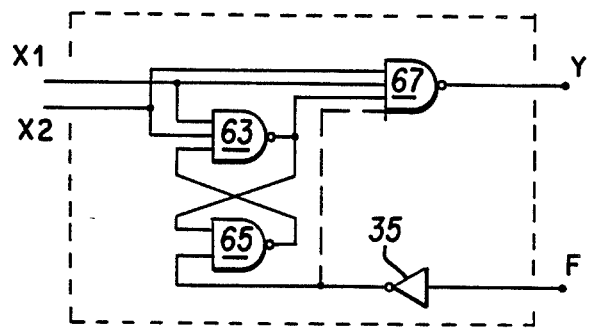
FIG. 11 is a schematic diagram of another DERIVER circuit of the invention implementing an AND function.

The logical function will be realized by either placing before the DERIVER an ordinary AND circuit 41, as shown in FIG. 10, or realizing the function inside the DERIVER itself, as shown in FIG. 11. In FIG. 11, the input signals $x_1 \ldots x_n$ (only two $x_1$, $x_2$ shown for convenience) are applied to respective inputs of AND gate 67 and NAND gate 63, the latter of which is cross-coupled with NAND gate 65, the latter of which is cross-coupled with NAND gate 65 to produce a flip-flop. NAND gate 65 also receives the feedback signal F through inverter 35. AND gate 67 also receives as an input, the output P of NAND gate 63.

The OR logical function is given by the sum of the values of input signal $Y = X_1 \cup X_2 \vee \ldots X_n$) (where $\vee$ represents an OR function; for simplification only two inputs $X_1$ and $X_2$ are described); in the present case the function in output will depend again on the state of the DERIVER, hence the equation of the OR DERIVER ($\Delta$OR) will be:

$$Y = (X_1 \cup X_2) \cap (P \cap F)$$

Figure 12:
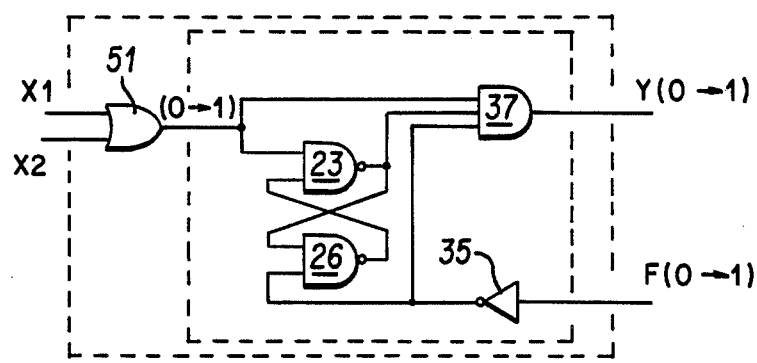
FIG. 12 is a schematic diagram of a DERIVER circuit of the invention implementing an OR function.
Figure 13:
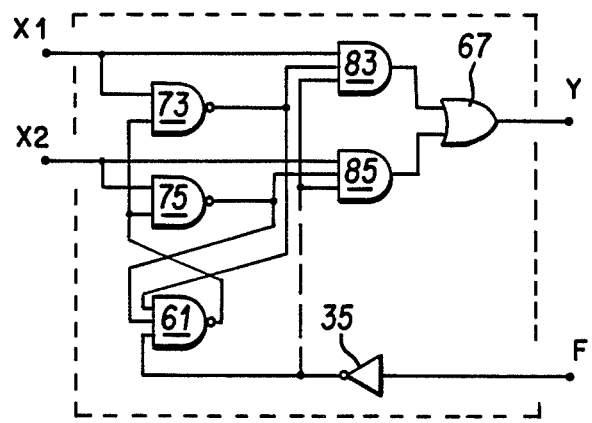
FIG. 13 is a schematic diagram of another DERIVER circuit of the invention implementing an OR function.

The function will be performed by either placing before the DERIVER an ordinary OR circuit 51, as shown in FIG. 12 or realizing the function inside the DERIVER itself, as shown in FIG. 13. The logical function of this last circuit will be:

$$Y = (X_1 \cap P_1 \cap F) \cup (X_2 \cap P_2 \cap F)$$

As shown in FIG. 13, the two input signals $X_1$, $X_2$ are respectively applied to NAND gates 73 and 75 and to respective inputs of AND gates 83 and 85, NAND gates 73 and 75 also receive as an input thereto, the output of NAND gate 61, which in turn receives as input signals, the outputs of NAND gates 73 and 75 and inverter 35 (for the feedback signal F). AND gate 83 also receives the output of gate 73 and inverter 35, while AND gate 85 also receives the output signals from gate 75 and inverter 35.

The functions NAND and NOR are obviously obtained by logical negation of the output of the AND and OR DERIVERS herein described, for example, by adding an inverter to the output of the circuits shown in FIGS. 10–13.

Thus, a DERIVER in accordance with the invention in its form of a Boolean differentiating network operator has two parts: the first one assumes the structure of the function to be performed, such as derivative, NOT, AND, OR as well as the combination of the same, while the second part, namely the flip-flop (formed by gates 23, 25) for the feedback state memorization, remains substantially unchanged.

It is also possible to perform the same function placing the memorization flip-flop of the DERIVER state either before or after the operator that identifies the function. For any of the DERIVER circuits described herein it is possible to adopt the connection that cancels the static hazard discussed earlier, as represented by the dotted lines in each of FIGS. 10, 11, 12, and 13; the DERIVER circuit logical equation will remain unchanged.

It will obviously be possible to realize, for all types of DERIVER circuits, the full independence from the feedback state by utilizing the basic circuit shown in FIG. 4. DERIVERS which form part of the present invention can also be constructed to perform complex functions, for example XOR, by adding logical gates to perform such function, e.g., XOR, to any of the three types of DERIVERS discussed above with respect to FIGS. 4, 6 and 9, in the manner described above for FIGS. 10, 11, 12 and 13 for the AND and OR functions.

I claim:

1. A digital logic circuit comprising:
   means for receiving at least one input signal X;
   means connected to said receiving means and responsive to a change of logic level of said at least one input signal X to produce a change of logic level in an output signal Y from a rest logic level to another logic level;
   means for receiving at least one feedback signal F from a circuit utilizing said output signal Y; and
   means connected to said feedback signal receiving means and responsive to a change of logic level in said feedback signal F to return said output signal Y back to said rest logic level.

2. A digital logic circuit as in claim 1, wherein said means for producing a change in logic level of said output signal Y from said rest logic level operates independently of the logic level of said feedback signal F.

3. A digital logic circuit as in claim 2, which comprises a first gate for receiving said input signal X, and a first flip-flop having one input receiving said input signal X and another input responsive to said at least one feedback signal F, said first gate also receiving as an input an output signal P of said first flip-flop.

4. A digital logic circuit as in claim 3, further comprising a second flip-flop having one input receiving said output signal Y and another input receiving said at least one feedback signal F, a second gate having one input receiving an output S of said second flip-flop and another input receiving said at least one feedback signal F, the output of said second gate being applied to said another input of said first flip-flop.

5. A digital logic circuit as in claim 1, further comprising means for producing a feedback signal E for another circuit from said outpu signal Y.

6. A digital logic circuit as in claim 5, wherein said means for producing said feedback signal E is an inverter.

7. A digital logic circuit as in claim 4, which has the logical equation:

$$Y = X \cap P \cap (F \overline{\cap} S \overline{\cap} Y)$$

where $\cap$ represents a logical AND function, and $\overline{\cap}$ represents the inverse of a logical AND function.

8. A digital logic circuit as in claim 1, wherein said means for producing a change in logic level of said output signal Y from said rest logic level operates in dependence on the current logic level of said feedback signal F such that said feedback signal F must have a predetermined logic level during said change of logic level of input signal X to permit a change in logic level of output signal Y from said rest logic level.

9. A digital logic circuit as in claim 8, which comprises a first gate responsive to said input signal X, and a first flip-flop having one input responsive to said input signal X and another input responsive to said at least one feedback signal F, said first gate having another input for receiving an output signal P of said first flip-flop.

10. A digital logic circuit as in claim 9, further comprising an inverter for inverting said at least one feedback signal F and for supplying an inverted feedback signal $\overline{F}$ to said another input of said first flip-flop.

11. A digital logic circuit as in claim 10, having the logical equation:

$$Y = X \cap (P \cap \overline{F})$$

where ∩ represents a logical AND function.

12. A digital logic circuit as in claim 11, wherein said first gate has a third input thereto which receives the output signal of said inverter.

13. A digital logic circuit as in claim 1, wherein said means for receiving said at least one input signal X is an AND gate which receives a plurality of input signals and said means for producing a change in logic level of said output signal Y from said rest logic level produces said change in response to a change of output logic level of said AND gate.

14. A digital logic circuit as in claim 10, further comprising an AND gate having respective inputs for receiving a plurality of input signals $X_1 \ldots X_n$, said first gate receiving the output signal of said AND gate, said first flip-flop at said one input thereof also receiving the output of said AND gate, said digital logical circuit having the logical equation: $(X_1 \cap X_2 \cap \ldots X) \cap (P \cap \overline{F})$, where ∩ represents a logical AND function.

15. A digital logic circuit as in claim 2, wherein said means for receiving at least one input signal receives a plurality of input signals $X_1 \ldots X_n$ and said means responsive to a change of logic level produces said change of logic level of said output signal Y by performing a logical AND function on said input signals.

16. A digital logic circuit as in claim 8, wherein said means for receiving at least one input signal receives a plurality of input signals $X_1 \ldots X_n$ and said means responsive to a change of logic level produces said change of logic level of said output signal Y by performing a logical AND function on said input signals.

17. A digital logic circuit as in claim 2, wherein said means for receiving at least one input signal receives a plurality of input signals $X_1 \ldots X_n$, and said means responsive to a change of logic level produces said change of logic level of said output signal Y by performing a logical OR function on said input signals.

18. A digital logic circuit as in claim 8, wherein said means for receiving at least one input signal receives a plurality of input signals $X_1 \ldots X_n$, and said means responsive to a change of logic level produces said change of logic level of said output signal Y by performing a logical OR function on said input signals.

19. A digital logic circuit as in claim 15, further comprising means for inverting said output signal Y.

20. A digital logic circuit as in claim 16, further comprising means for inverting said output signal Y.

21. A digital logic circuit as in claim 17, further comprising means for inverting said output signal Y.

22. A digital logic circuit as in claim 18, further comprising means for inverting said output signal Y.

23. A digital logic circuit as in claim 2, which comprises a first gate responsive to said input signal X, and a first flip-flop having one input responsive to said input signal X and another input responsive to said at least one feedback signal F, said first gate having another input for receiving an output signal P of said first flip-flop.

24. A digital logic circuit as in claim 23, further comprising an inverter for inverting said at least one feedback signal F and for supplying an inverted feedback signal $\overline{F}$ to said another input of said first flip-flop.

25. A digital logic circuit as in claim 15, which comprises a first AND gate for receiving a plurality of applied input signals $X_1 \ldots X_n$, a flip-flop having one input receiving the output of said first AND gate an another input responsive to said at least one feedback signal, a second AND gate having a first input for receiving an output signal of said first AND gate, and a second input for receiving an output of said flip-flop, said output signal Y being taken from an output of said second AND gate.

26. A digital logic circuit as in claim 16, which comprises a first AND gate for receiving a plurality of applied input signals $X_1 \ldots X_n$, a flip-flop having one input receiving the output of said first AND gate and another input responsive to said at least one feedback signal, a second AND gate having a first input for receiving an output signal of said first AND gate, a second input for receiving an output of said flip-flop and a third input responsive to said at least one feedback signal, said output signal Y being taken from an output of said second AND gate.

27. A digital logic circuit as in claim 15, which comprises an AND gate having inputs respectively receiving said input signals $X_1 \ldots X_n$, and a flip-flop formed by cross-coupled NAND gates, one of said NAND gates having respective inputs receiving said input signals $X_1 \ldots X_n$ and another input receiving an output of another NAND gate, said AND gate having an input for receiving an output of said one NAND gate, said another NAND gate having one input connected to be responsive to said at least one feedback signal and another input receiving the output from said one NAND gate.

28. A digital logic circuit as in claim 16, which comprises an AND gate having inputs respectively receiving said input signals $X_1 \ldots X_n$, and a flip-flop formed by cross-coupled NAND gates, one of said NAND gates having respective inputs receiving said input signals $X_1 \ldots X_n$ and another input receiving the output of another NAND gate, said AND gate having an input for receiving an output of said one NAND gate, said another NAND gate having one input connected to be responsive to said at least one feedback signal and another input receiving the output from said one NAND gate, said AND gate having another input responsive to said at least one feedback signal.

29. A digital logic circuit as in claim 17, which comprises an OR gate having inputs for receiving respective input signals $X_1 \ldots X_n$, a flip-flop having one input receiving the output of said OR gate and another input responsive to said at least one feedback signal, and an AND gate having one input for receiving an output of said OR gate, and another input for receiving an output of said flip-flop.

30. A digital logic circuit as in claim 18, which comprises an OR gate having inputs for receiving respective input signals $X_1 \ldots X_n$, a flip-flop having one input receiving the output of said OR gate and another input responsive to said at least one feedback signal, and an AND gate having one input for receiving an output of said OR gate, another input for receiving an output of said flip-flop, and another input responsive to said at least one feedback signal.

31. A digital logic circuit as in claim 29, which has the logical equation $Y = (X_1 \cup X_2 \cap \ldots X_n) \cap (P \cap \overline{F})$, where ∪ represents a logical OR function and ∩ represents a logical AND function.

32. A digital logic circuit as in claim 30, which has the logical equation $Y = (X_1 \cup X_2 \cup \ldots X_n) \cap (P \cap \overline{F})$, where ∪ represents a logical OR function and ∩ represents a logical AND function.

33. A digital logic circuit as in claim 18, comprising a plurality of NAND gates each having a first input respectively receiving one of said applied input signals $X_1 \ldots X_n$, a plurality of AND gates, each having one input for receiving a respective input signal $X_1 \ldots X_n$ and another input for receiving a respective output from said plurality of NAND gates, another NAND gate cross-coupled to said plurality of NAND gates to form a flip-flop, an output of said another NAND gate being supplied commonly to second inputs of said plurality of NAND gates, said another NAND gate having one input responsive to said at least one feedback signal and a plurality of other inputs respectively receiving outputs of said plurality of NAND gates, and an OR gate having a plurality of inputs respectively receiving outputs of said AND gates, said output signal Y being taken at an output of said OR gate, said AND gates also having respective inputs responsive to said at least one feedback signal.

34. A digital logic circuit as in claim 33, having the logical equation:

$$Y = (X_1 \cap P_1 \cap \bar{F}) \cup (X_2 \cap P_2 \cap \bar{F}) \cup \ldots (X_n \cap P_n \cap \bar{F}).$$

35. A digital logic circuit as in claim 18, comprising a plurality of NAND gates each having a first input respectively receiving one of said applied input signals $X_1 \ldots X_n$, a plurality of AND gates, each having one input for receiving a respective input signal $X_1 \ldots X_n$ and another input for receiving a respective output from said pluarlity of NAND gates, another NAND gate cross-coupled to said plurality of NAND gates to form a flip-flop, an output of said another NAND gate being supplied commonly to second inputs of said plurality of NAND gates, said another NAND gate having one input responsive to said at least one feedback signal and a plurality of other inputs respectively receiving outputs of said plurality of NAND gates, and an OR gate having a plurality of inputs respectively receiving the outputs of said AND gates, said output signal Y being taken at an output of said OR gate.

36. A digital logic circuit as in claim 35, having the logical equation:

$$Y = (X_1 \cap P_1 \cap \bar{F}) \cup (X_2 \cap P_2 \cap \bar{F}) \cup \ldots (X_n \cap P_n \cap \bar{F}).$$

37. A digital logic circuit as in claim 2, wherein said means for receiving at least one input signal X receives a plurality of input signals $X_1 \ldots X_n$ and said means for producing a change in logic level of said output signal Y from said rest logic level produces said change in response to a predetermined logical combination of the logic levels of said input signals.

38. A digital logic circuit as in claim 37, wherein said predetermined logical combination is an AND function.

39. A digital logic circuit as in claim 37, wherein said predetermined logical combination is an OR function.

40. A digital logic circuit as in claim 37, wherein said predetermined logical combination is an XOR function.

41. A digital logic circuit as in claim 37, wherein said predetermined logical combination is a NAND function.

42. A digital logic circuit as in claim 37, wherein said predetermined logical combination is a NOR function.

43. A digital logic circuit as in claim 8, wherein said means for receiving at least one input signal X receives a plurality of input signals $X_1 \ldots X_n$ and said means for producing a change in logic level of said output signal Y from said rest logic level produces said change in response to a predetermined logical combination of the logic levels of said input signals.

44. A digital logic circuit as in claim 43, wherein said predetermined logical combination is an AND function.

45. A digital logic circuit as in claim 43, wherein said predetermined logical combination is an OR function.

46. A digital logic circuit as in claim 43, wherein said predetermined logical combination is an XOR function.

47. A digital logic circuit as in claim 43, wherein said predetermined logical combination is a NAND function.

48. A digital logic circuit as in claim 43, wherein said predetermined logical combination is a NOR function.

* * * * *